United States Patent [19]

Lemmer

[11] 4,157,048
[45] Jun. 5, 1979

[54] CUTTING APPARATUS FOR TRIMMING COMPONENT LEADS PROJECTING FROM THE UNDERSIDE OF A PRINTED WIRING BOARD

[76] Inventor: Alfred Lemmer, Machtlfingerstrasse 24, 8000 Munich 70, Fed. Rep. of Germany

[21] Appl. No.: 901,787

[22] Filed: May 1, 1978

[30] Foreign Application Priority Data

May 27, 1977 [DE] Fed. Rep. of Germany ....... 2724143

[51] Int. Cl.² .......................... B26D 1/08; H05K 13/06
[52] U.S. Cl. ......................................... 83/579; 83/580; 83/582; 83/620; 83/698
[58] Field of Search ................. 83/579, 580, 582, 620, 83/698

[56] References Cited

U.S. PATENT DOCUMENTS

| | | | |
|---|---|---|---|
| 2,696,880 | 12/1954 | Bechard et al. | 83/579 X |
| 3,270,606 | 9/1966 | Schott, Jr. | 83/579 |
| 3,307,442 | 3/1967 | Imhoff | 83/580 |
| 3,545,327 | 12/1970 | Dorman | 83/580 X |

Primary Examiner—Frank T. Yost
Attorney, Agent, or Firm—Fitzpatrick, Cella, Harper & Scinto

[57] ABSTRACT

A cutting knife used to trim the leads of electrical components which extend through a printed circuit board during manufacture of the board. The knife is made up of a plurality of adjacent knife sections separately resiliently biased against the underside of the board and freely pivotally and tiltably movable over a limited range.

16 Claims, 5 Drawing Figures

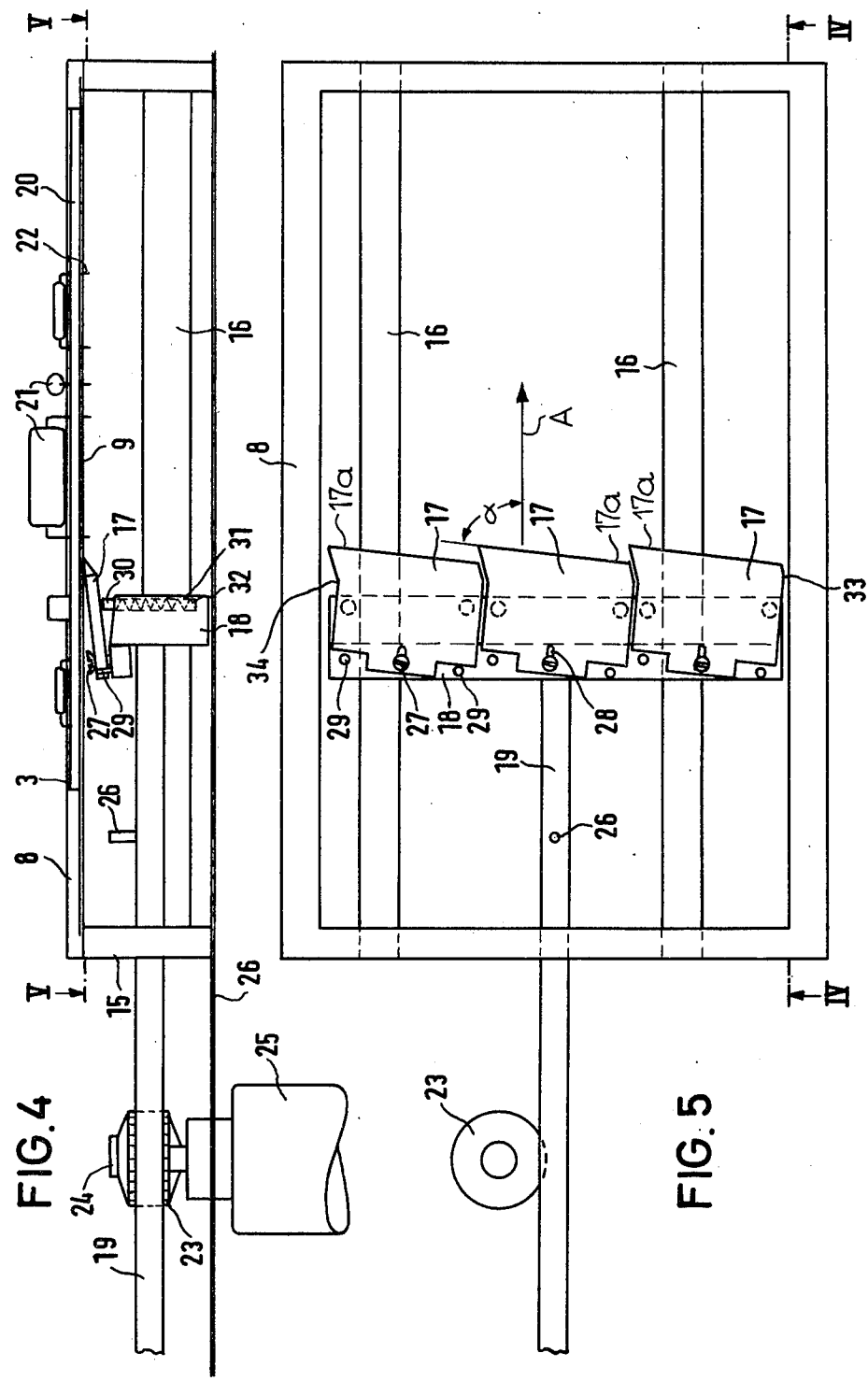

CUTTING APPARATUS FOR TRIMMING COMPONENT LEADS PROJECTING FROM THE UNDERSIDE OF A PRINTED WIRING BOARD

BACKGROUND OF THE INVENTION

1. Field of the Invention

This invention relates to cutting apparatus for trimming the leads of electrical componenets mounted on a printed wiring board which project from its underside. Apparatus of the type to which this invention pertains comprises a receiving frame for the printed wiring board, a cutting plate disposed on the receiving frame and provided with peforations through which the leads of the electrical components on the circuit board may be pushed, and a knife which is slidingly disposed on the underside of the cutting plate and is movable by a drive in the longitudinal direction of the frame.

2. Description of the Prior Art

German Patent DT-GM 75 12 151 discloses prior art cutting apparatus of the type to which the present invention pertains. In such apparatus there is provided a cutting blade or plate which must be very thin in order that the leads may be trimmed very short. This thin cutting blade is made of sheet metal and therefore has a tendency to warp. Furthermore, the prior art cutting apparatus is constructed such that its knife, which is rigidly guided extends over the entire width of the frame. Warping of the knife blade in such case poses the danger that the leads may be trimmed to different lengths.

SUMMARY OF THE INVENTION

The present invention, in its broader aspects, avoids the warping problem described above and provides a new and improved cutting apparatus for trimming the leads on a printed wiring board in such a way that the leads are trimmed to the same length everywhere on the board.

In accordance with the invention, there is provided a divided knife having a plurality of knife sections arranged side by side and mounted so as to omnidirectionally movable within limits.

The knife sections of the invention are shorter than the single knife in the prior art apparatus, and, since they are movably mounted, they accommodate themselves optimally to the cutting plate at all points thereof, thus asserting that the leads are trimmed to the same short length everywhere.

According to a more specific aspect of the invention the knife sections are supported on a sliding block mounted on slide guides; and each knife section is loosely fastened to the sliding block with one screw. Each screw projects through an elongated slot in its associated knife section and extending in the direction of displacement of the particular knife section. In order to limit the extent of motion about the axis of each screw, stops are provided on the sliding block on either side of the screw and are located to engage the back of the knife section when it has been rotated by a predetermined amount.

Another specific aspect of the invention involves arranging each knife section to have some play between the sliding block and the screw head to permit a tilting motion of the knife section.

To make certain that the knife sections hug the underside of the cutting plate, each knife section may be pressed resiliently against the cutting plate. This may be accomplished by providing in the sliding block beneath each knife section two blind holes from which resilient means such as pins supported on springs project to press from below against the knife section.

According to a still further aspect of the invention, the knife sections are of uniform construction and the cutting edge of each knife section is arranged at an acute angle to the direction of advance or cutting.

In order to make certain that no lead gets into the gap between two adjacent knife sections and consequently not be trimmed, one of the lateral edges of each knife section is provided with a projection forming an obtuse angle, and its other lateral edge is provided with a notch forming the same obtuse angle. The projection on each knife section mates with the corresponding notch in the adjacent knife section in a manner which allows some play between them.

BRIEF DESCRIPTION OF THE DRAWINGS

An embodiment of the invention is described below with reference to the drawing, where:

FIG. 4 is an enlarged side elevational section view through a cutting apparatus used in the table of FIG. 1 as taken along the line IV—IV of FIG. 5; and FIG. 5 is a section view through the cutting apparatus, taken along the line V—V of FIG. 4.

DETAILED DESCRIPTION OF THE PREFERRED EMBODIMENT

Figures 1, 2:
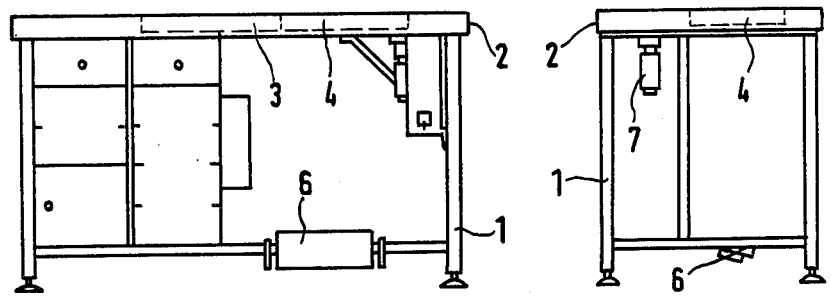
FIG. 1 is a front elevational view of a component-insertion table equipped with the cutting apparatus in accordance with the invention.
FIG. 2 is a side elevation of the component-insertion table of FIG. 1.
Figure 3:
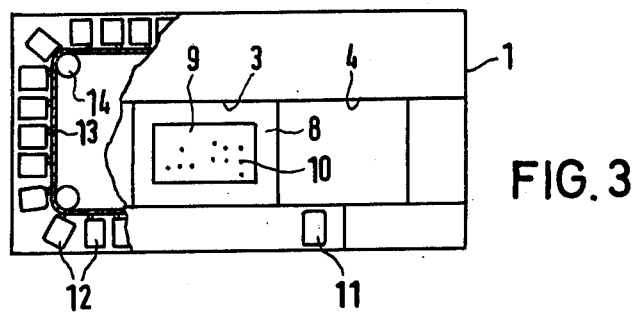
FIG. 3 is a top view of the top of the component-insertion table of FIG. 1, with a portion of the top being broken away.

The component-insertion table shown in FIGS. 1 to 3 has a table top 2 provided with three cutouts 3, 4 and 11.

Below the two cutouts 3 and 4 there is a table pan 26, visible in FIG. 4. The cutout 4 serves to accommodate special equipment and in the present case is covered. Set into the cutout 3 is a receiving frame 8 for a printed wiring board 20 (see FIG. 4), said frame being provided with a perforated cutting plate 9. Holes 10 are provided in the cutting plate to coincide with the hole grid of the wiring board 20 on which electrical components are mounted; and leads 22 (see FIG. 4) on these components extend through the holes 10.

Underneath the table top 1 there is provided an endless chain belt 13 to which trays 12 are secured. The various components are disposed in these trays. The chain belt 13 runs around end rolls 14 in the table to move the trays 12 in succession under the cutout 11 in the table so that the trays are selectively accessible through the cutout. The chain belt 13 may be set in motion by means of a pedal 6 which controls a switch (not shown) to energize a drive motor 7.

Below the cutting plate 9, three knife sections 17 of uniform construction are arranged side by side in such a way that they are able to slide along the underside of the cutting plate 9 in the direction of the arrow A (FIG. 5). The knife sections 7 are fastened to a sliding block 18 by means of screws 27. The sliding block 18 in turn is arranged to be moved on slide guides 16 by means of a rack 19 which meshes with the drive pinion 23 of a motor 25. A friction safety clutch 24 is interposed between the drive pinion 23 and the motor.

The motor 25 is mounted on a table pan 26 which extends under the upper surface of the table. The guides 16 are fixed to a holding frame 15 which also carries the receiving frame 8 for the wiring board 20. This holding frame sits on top of the table pan 26. The path of displacement of the rack 19 is limited in its rearward motion by a stop 19a which engages the frame 15.

Each knife section 17 has a front cutting edge 17a disposed at an acute angle α to the direction of advance.

Each knife section 17 is provided with an elongated hole 28 through which the shank of mounting screw 27 extends. Each hole 28 is in the form of an elongated slot which extends in the direction of displacement of its associated knife section. The mounting screw 27 holds its associated knife section 17 to the sliding block 18 in a manner which allows free omnidirectional movement of the knife sections. There is also provided sufficient play between the head of each screw 27 and the sliding block 18 to permit the knife section 17 to tilt and rotate. In order to limit the rotary motion of each knife section 17 about the axis of its screw 27, stop pins 29 are disposed on the sliding block 18 on either side of the screw. These stop pins engage the back edge of a knife section when it has rotated to a predetermined limit.

Two blind holes 31 are provided in the sliding block 18 for each knife section 17. Disposed in each hole 31 is a pin 30 projecting from it and supported on a spring 32 also disposed in the hole 31 under the pin. The underside of each knife section 17 is acted upon by two of the thus spring loaded pins 30; and the knife section is thereby pressed by this resilient means against the underside of the cutting plate 9.

Each knife section is provided with an obtusely angled recess 34 in one lateral edge and an obtusely angled projection 33 along the opposite lateral edge. In each case the projection 33 of one knife section mates with the recess 34 in the adjacent knife section to a degree that permits play between them.

Mounted on the wiring board 20 are electrical components 21 whose leads extend through holes in the wiring board 20 and in the cutting plate 9.

In operation the motor 25 operates throug the drive pinion 23 to move the rack 19 and the sliding block 18 forwardly to advance the knife sections 17. When the knife sections 17 are advanced, they cut off the ends 22 of the leads projecting below the cutting plate 9.

When, after cutting the wiring board 20 is removed from the cutout 3, the ends of the leads on the underside of the circuit board are all of the same short length. The circuit board can then be dipped in a solder bath so as to solder the short ends of the leads to printed conductors on the wiring board.

What is claimed and desired to be secured by Letters Patent is:

1. A cutting apparatus for trimming the leads of the components mounted on a printed wiring board which project from its underside, said apparatus comprising a receiving frame for the wiring board, a cutting plate which is disposed on the receiving frame and is provided with perforations through which the leads of the circuit board extend, a knife, knife supporting means for supporting said knife to be slidingly disposed on the underside of the cutting plate, and drive means for moving said knife in the longitudinal direction of the frame, said knife comprising a plurality of knife sections arranged side by side and mounted for free omnidirectional movement within predetermined limits.

2. A cutting apparatus as defined in claim 1, wherein said knife supporting means comprises a sliding block mounted on slide guides and wherein each knife section is loosely fastened to said sliding block with one screw.

3. A cutting apparatus as defined in claim 2, wherein each screw projects through an elongated slot extending in the direction of displacement of its associated knife section and wherein stops are provided on the sliding block on opposite sides of each screw to engage the back edge of each associated knife section upon rotation thereof by a predetermined amount.

4. A cutting apparatus as defined in claim 2 wherein each screw has its head displaced a sufficient distance from the sliding block to allow each knife section sufficient play to permit a tilting motion of the knife section.

5. A cutting apparatus as defined in claim 3 wherein each screw has its head displaced a sufficient distance from the sliding block to allow each knife section sufficient play to permit a tilting motion of the knife section.

6. A cutting apparatus as defined in claim 2 wherein there are provided resilient means arranged to press each knife section from below against the cutting plate.

7. A cutting apparatus as defined in claim 3 wherein there are provided resilient means arranged to press each knife section from below against the cutting plate.

8. A cutting apparatus as defined in claim 4 wherein there are provided resilient means arranged to press each knife section from below against the cutting plate.

9. A cutting apparatus as defined in claim 5 wherein there are provided resilient means arranged to press each knife section from below against the cutting plate.

10. A cutting apparatus as defined in claim 6, 7, 8 or 9 wherein said resilient means comprises springs disposed in blind holes in the sliding block beneath each knife section with pins also disposed in said holes and pushed outwardly therefrom and against the knife sections by said springs.

11. A cutting apparatus as defined in any of claims 1 through 9 wherein the cutting edge of each knife section is disposed at an acute angle to the direction of advance, and wherein the knife sections are of uniform construction.

12. A cutting apparatus as defined in claim 10 wherein the cutting edge of each knife section is disposed at an acute angle to the direction of advance, and wherein the knife sections are of uniform construction.

13. A cutting apparatus as defined in any of claims 1 through 9 wherein one of the lateral edges of each knife section has an obtusely angled projection and the other lateral edge has an obtusely angled recess and wherein the projection on one knife section mates with the recess in the adjacent knife section to a degree that permits some play between them.

14. A cutting apparatus as defined in claim 10 wherein one of the lateral edges of each knife section has an obtusely angled projection and the other lateral edge has an obtusely angled recess and wherein the projection on one knife section mates with the recess in the adjacent knife section to a degree that permits some play between them.

15. A cutting apparatus as defined in claim 11 wherein one of the lateral edges of each knife section has an obtusely angled projection and the other lateral edge has an obtusely angled recess and wherein the projection on one knife section mates with the recess in the adjacent knife section to a degree that permits some play between them.

16. A cutting apparatus as defined in claim 12 wherein one of the lateral edges of each knife section has an obtusely angled projection and the other lateral edge has an obtusely angled recess and wherein the projection on one knife section mates with the recess in the adjacent knife section to a degree that permits some play between them.

* * * * *